(12) United States Patent
Jung

(10) Patent No.: US 7,651,567 B2
(45) Date of Patent: Jan. 26, 2010

(54) MASK FOR SEQUENTIAL LATERAL SOLIDIFICATION AND CRYSTALLIZATION METHOD USING THEREOF

(75) Inventor: Yun-Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 12/002,759

(22) Filed: Dec. 19, 2007

(65) Prior Publication Data

US 2008/0141935 A1 Jun. 19, 2008

Related U.S. Application Data

(62) Division of application No. 11/029,395, filed on Jan. 6, 2005, now Pat. No. 7,329,936, which is a division of application No. 10/454,679, filed on Jun. 5, 2003, now Pat. No. 6,867,151.

(30) Foreign Application Priority Data

Dec. 31, 2002 (KR) ............................... 2002-88532

(51) Int. Cl.
*C30B 1/02* (2006.01)
(52) U.S. Cl. ............................... 117/201; 117/4; 117/5; 117/202; 117/203
(58) Field of Classification Search ............. 117/4, 117/5, 201, 202, 203
See application file for complete search history.

(56) References Cited

U.S. PATENT DOCUMENTS

| 6,177,301 | B1 | 1/2001 | Jung |
| 6,316,338 | B1 | 11/2001 | Jung |
| 6,326,286 | B1 | 12/2001 | Park et al. |
| 6,726,768 | B2 | 4/2004 | Yoon |
| 6,741,621 | B2 | 5/2004 | Asano |

(Continued)

FOREIGN PATENT DOCUMENTS

JP 11-064883 3/1999

(Continued)

*Primary Examiner*—Robert M Kunemund
(74) *Attorney, Agent, or Firm*—McKenna Long & Aldridge LLP

(57) ABSTRACT

A method of forming a polycrystalline silicon layer includes: disposing a mask over the amorphous silicon layer, the mask having a plurality of transmissive regions, the plurality of transmissive regions being disposed in a stairstep arrangement spaced apart from each other in a first direction and a second direction substantially perpendicular from the first direction, each transmissive region having a central portion and first and second side portions that are adjacent to opposite ends of the central portion along the first direction, and wherein each of the portions has a length along the first direction and a width along the second direction, and wherein the width of first and second portions decreases away from the central portion along the first direction; irradiating a laser beam onto the amorphous silicon layer a first time through the mask to form a plurality of first irradiated regions corresponding to the plurality of transmissive regions, each first irradiated region having a central portion, and first and second side portions at both sides of the central portion; moving the substrate and the mask relative to one another such that the first side portion of each transmissive region overlaps the central portion of each first irradiated region; and irradiating the laser beam onto the amorphous silicon layer a second time through the mask to form a plurality of second irradiated regions corresponding to the plurality of transmissive regions.

4 Claims, 7 Drawing Sheets

U.S. PATENT DOCUMENTS

| | | |
|---|---|---|
| 2002/0179004 A1 | 12/2002 | Jung |
| 2002/0179959 A1 | 12/2002 | Fuji et al. |
| 2003/0022421 A1 | 1/2003 | Shimoto et al. |

FOREIGN PATENT DOCUMENTS

| | | |
|---|---|---|
| JP | 2002-261016 | 9/2002 |
| JP | 2002-324759 | 11/2002 |
| JP | 2003-051445 | 2/2003 |
| JP | 2003-109903 | 4/2003 |
| KR | 2001-25694 | 11/2002 |
| KR | 2002-0086047 | 11/2002 |
| KR | 2001-30698 | 12/2002 |
| KR | 2002-0091896 | 12/2002 |
| WO | WO 02/086954 | 10/2002 |

MASK FOR SEQUENTIAL LATERAL SOLIDIFICATION AND CRYSTALLIZATION METHOD USING THEREOF

This is a divisional application of application Ser. No. 11/029,395 filed Jan. 6, 2005 now U.S. Pat. No. 7,329,936, which is a divisional application of application Ser. No. 10/454,679 filed Jun. 5, 2003 now U.S. Pat. No. 6,867,151, which claims the benefit of Korean Patent Application No. 2002-88532, filed on Dec. 31, 2002, which is hereby incorporated by references for all purposes as if fully set forth herein.

BACKGROUND OF THE INVENTION

1. Field of the Invention

The present invention relates to a method of crystallizing an amorphous silicon layer, and more particularly to a mask for a sequential lateral solidification of an amorphous silicon layer and a crystallization method thereof.

2. Discussion of the Related Art

In general, silicon is classified into amorphous silicon (a-Si) and polycrystalline silicon (p-Si) according to the phase of silicon. Since amorphous silicon (a-Si) can be deposited at a low temperature to form a thin film on a glass substrate, amorphous silicon (a-Si) is commonly used in switching devices of liquid crystal displays (LCDs) using the glass substrate. Unfortunately, amorphous silicon thin film transistors (a-Si TFTs) have relatively slow display response times due to their poor electrical properties that limit their suitability for large area LCDs.

In contrast, polycrystalline silicon thin film transistors (p-Si TFTs) provide much faster display response times. Thus, polycrystalline silicon (p-Si) is well suited for use in large LCD devices, such as laptop computers and wall-mounted television sets. A thin film of polycrystalline silicon is composed of crystal grains having grain boundaries. The larger the grains and the more regular the grains boundaries, the better the field effect mobility. Thus, a silicon crystallization method that produces large grains, ideally a single crystal, would be advantageous.

One method of crystallizing amorphous silicon into polycrystalline silicon is the sequential lateral solidification (SLS) method. The SLS method uses the fact that silicon grains tend to grow laterally from the interfaces between liquid phase and solid phase silicon such that the resulting grain boundaries are perpendicular to the interfaces. With the SLS method, amorphous silicon is crystallized by irradiating a specific area with a laser beam through a mask such that the melted silicon forms laterally grown silicon grains upon re-crystallization. Next, the mask is moved, and the laser irradiates a new area. This process is then repeated until the desired area is crystallized.

FIG. 1 is a schematic view showing a configuration of an apparatus for a sequential lateral solidification method according to a related art.

In FIG. 1, an apparatus for a sequential lateral solidification (SLS) method includes a laser generator 36, a first optical unit 40, a mask assembly 32, a second optical unit 42 and a stage 46. The laser generator 36 generates and emits a laser beam 34. The intensity of the laser beam 34 can be adjusted by an attenuator (not shown) in the path of the laser beam 34. The laser beam 34 is then condensed by the first optical unit 40 and directed onto the mask assembly 32. The laser beam 34 is processed through the mask assembly 32 and then again condensed by the second optical unit 42. The condensed laser beam 34 is irradiated onto a specific region of a substrate 44 on the stage 46 movable along the x and y directions. Even though not shown in FIG. 1, a buffer layer is formed on the substrate and an amorphous silicon layer is formed on the buffer layer. A dehydrogenation process may be performed for the amorphous silicon layer before the crystallizing process.

The mask assembly 32 includes a mask 38 having a transmissive region "A" through which the laser beam 34 passes and a shielding region "B" which screens the laser beam 34. Accordingly, the irradiated shape of the amorphous silicon layer is dependent on the mask 38. Because the size of the laser beam 34 and the size of the mask 38 are limited in the present technology, it is impossible to crystallize the entire amorphous silicon layer simultaneously. Therefore, to crystallize the amorphous silicon layer by using the apparatus of the SLS method, the following steps are repeated: the laser beam 34 irradiates the substrate through the mask 38; and the substrate 44 or the mask assembly 32 moves by several micrometers or several tens micrometers. Thus, the amorphous silicon layer is crystallized one section at a time, and the crystallization process is repeated for each section.

FIGS. 2A to 2C are schematic plane views showing crystallization states of an amorphous silicon layer by an SLS method according to the related art. For example, an apparatus for the SLS method of FIG. 1 is used.

In FIG. 2A, a laser beam 34 (FIG. 1) irradiates am amorphous silicon layer 52 through a mask 38 (FIG. 1). Accordingly, only a first irradiation region of the amorphous silicon layer 52 is melted. This irradiation region includes a first, second, and third portions D, E, and F corresponding to the transmissive region A (FIG. 1) of the mask 38 (FIG. 1). Here, laser beam energy (FIG. 1) is within the complete melting regime where the amorphous silicon layer 52 is completely melted.

After the laser beam 34 (FIG. 1) first irradiates the substrate a silicon grain 58a grows laterally from an interface 56 between liquefied silicon and adjacent solid silicon to form polycrystalline silicon. The silicon grain 58a grows toward a center of the liquefied silicon along a perpendicular direction to the interface 56. The maximum distance of grain growth depends on several factors such as the energy density of the laser beam, the substrate temperature, and the state of the amorphous silicon layer. In general, the maximum distance of grain growth is within a range of about 1 µm to about 2 µm. If the width of the transmissive region globally change A (FIG. 1) of the mask 38 (FIG. 1) is greater than twice the maximum distance of grain growth, a region of microcrystalline silicon is generated between the grains growing from the interfaces 56. To prevent the generation of a region of microcrystalline silicon, the width of the transmissive region A (FIG. 1) of the mask 38 (FIG. 1) should be less than twice of the maximum distance of grain growth. Polycrystalline silicon corresponding to the transmissive region A (FIG. 1) of the mask 38 (FIG. 1) is formed in the amorphous silicon layer 52 by the first irradiation of the laser beam.

In FIG. 2B, the laser beam 34 (FIG. 1) irradiates the amorphous silicon layer 52 (FIG. 2A) a second time through the mask 38 (FIG. 1). The second irradiation region of the laser beam 34 (FIG. 1) partially overlaps the first irradiation region including the first, second, and third portions D, E, and F (FIG. 2A), which were crystallized by the first irradiation of the laser beam 34 (FIG. 1), to prevent grain growth independent of crystallization by the first irradiation of the laser beam 34 (FIG. 1). When the maximum distance of grain growth is within a range of about 1 µm to about 2 µm, the substrate 44 (FIG. 1) or the mask assembly 32 (FIG. 1) of an apparatus for a SLS method should move by a distance less than about 1

μm. Accordingly, the second irradiation region includes a peripheral portion of the first irradiation region and the amorphous silicon layer adjacent to the first irradiation region. The polycrystalline silicon and the amorphous silicon in the second irradiation region are melted and then crystallized as described above. Therefore, the grain of the first irradiation region continues to grow laterally in the second irradiation region.

As shown in FIG. 2C, the amorphous silicon layer 52 (FIG. 2A) of one section is crystallized by repeating the irradiation and the movement, and thereby the entire amorphous silicon layer 52 (FIG. 2A) is crystallized.

Even though the SLS method produces large size grains, a crystallization direction is limited to either the vertical the horizontal directions. Moreover, because the mask or the substrate moves only by a several micrometers along the crystallization direction, the time required to move the mask or the substrate take a significant portion of the total process time. This significantly decreases manufacturing throughput. Therefore, a mask having a new pattern shape is suggested.

FIG. 3 is a schematic plane view showing a pattern shape of a mask for a sequential lateral solidification method according to the related art.

In FIG. 3, a mask 62 for a sequential lateral solidification (SLS) method includes first to sixth transmissive regions "N1" to "N6" having an equal rectangular shape. The number of the transmissive regions may be more or less than six. The six transmissive regions N1 to N6 are disposed along horizontal and vertical directions H and V. The first to third transmissive regions N1 to N3 are disposed in a stairstep arrangement along the horizontal direction 14. Similarly, the fourth to sixth transmissive portions N4 to N6 are disposed in a stairstep arrangement along the horizontal direction H. The first and fourth transmissive regions N1 and N4 are spaced apart from each other along the vertical direction V. Similarly, the second and fifth transmissive regions N2 and N5, and the third and sixth transmissive regions N3 and N4 are spaced apart from each other along the vertical direction V. The first to third transmissive regions N1 to N3 meet each other at their ends. The fourth to sixth transmissive regions N4 to N6 also meet each other at their ends. After first irradiation of the laser beam 34 (FIG. 1), the mask 62 or the substrate 44 (FIG. 1) moves along the horizontal direction H by the length of each transmissive region P.

FIGS. 4A to 4C are schematic plane views showing crystallization states of an amorphous silicon layer by a sequential lateral solidification method according to the related art.

FIG. 4A shows a crystallization state of an amorphous silicon layer 52 after the first irradiation of the laser beam 34 (FIG. 1) using a mask 62 (FIG. 3). First to sixth polycrystalline silicon regions M1 to M6 corresponding to the first to sixth transmissive regions N1 to N6 of the mask 62 (FIG. 3) are formed in the amorphous silicon layer 52.

In FIG. 4B, the solid line indicates the new position of the mask 62 (FIG. 3) after the first irradiation. The mask 62 or the substrate 44 (FIG. 1) moves along a horizontal direction H (FIG. 3) by a length P (FIG. 3). (The mask 62 moves in the opposite direction to the substrate 44.) After the mask 62 or the substrate 44 (FIG. 1) moves, the laser beam 34 (FIG. 1) irradiates the amorphous silicon layer 52 a second time.

FIG. 4C shows the crystallization state of the amorphous silicon layer 52 after the second irradiation of the laser beam 34 (FIG. 1). The polycrystalline silicon region is enlarged along the horizontal and vertical directions H and V (FIG. 3).

As shown in FIG. 4D, the entire amorphous silicon layer 52 (FIGS. 4A to 4C) is crystallized into a polycrystalline silicon layer 52a through repeating irradiation and movement by the length P (FIG. 3).

In the crystallization process using the mask 62 (FIG. 3) having six transmissive regions N1 to N6 (FIG. 3), the polycrystalline silicon region is enlarged along both of the horizontal and vertical directions H and V (FIG. 3) even though the mask 62 (FIG. 3) moves along the horizontal direction H (FIG. 3). Accordingly, the process time is reduced, and a uniform polycrystalline silicon layer is obtained due to regular irradiation and movement.

However, the mask 62 (FIG. 3) and the crystallization method illustrated in FIGS. 4A to 4D have some disadvantages such as a non-uniformity of crystallization at a borderline between the first and second irradiated regions. As shown in FIG. 4B, because the mask 62 (FIG. 3) moves by the length P (FIG. 3), the first transmissive region N1 does not overlap the first polycrystalline silicon region M1 during the second irradiation by the laser beam. When the laser beam passes through the transmissive region of the mask, the laser beam is distorted by diffraction at a boundary of the transmissive region. Accordingly, the energy of the laser beam is not sufficient for crystallization at the boundary of the transmissive region, and the amorphous silicon layer is not sufficiently crystallized at the boundary of the first polycrystalline silicon region M1. Because the second irradiated region overlaps the first irradiated region along the vertical direction V (FIG. 3), the insufficiently crystallized amorphous silicon layer at the top and bottom boundary is re-crystallized in a subsequent irradiation of the laser beam. However, since the second irradiated region does not overlap the first irradiated region along the horizontal direction H (FIG. 3), the insufficiently crystallized amorphous silicon layer at right and left boundary is not cured and re-crystallized even in a subsequent irradiation of the laser beam. Therefore, the amorphous silicon layer at the borderline k (FIG. 4B) between the first and second irradiated regions has a poor crystallization. When a device such as a thin film transistor is formed at the borderline k, this poor crystallinity of the borderline k causes a reduction of electrical characteristics of the device.

SUMMARY OF THE INVENTION

Accordingly, the present invention is directed to a sequential lateral solidification method that substantially obviates one or more of problems due to limitations and disadvantages of the related art.

An advantage of the present invention is to provide a mask for a sequential lateral solidification method and a crystallization method that improves uniformity of crystallization and production yield due to a reduction of process time.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming a polycrystalline silicon layer includes: disposing a mask over the amorphous silicon layer, the mask having a plurality of transmissive regions, the plurality of transmissive regions being disposed in a stairstep arrangement spaced apart from each other in a first direction and a second direction substantially perpendicular from the first direction, each transmissive region having a central portion and first and second side portions that are adjacent to opposite ends of the central portion along the first direction, and wherein each of the portions has a length along the first direction and a width along the second direction, and wherein the width of first and second portions decreases away from the central portion along the first direction; irradiating a laser beam onto the amorphous silicon layer a first time through the mask to form a plurality of first irradiated regions corresponding to the plurality of transmissive regions, each first irradiated region having a central portion, and first and second side portions at both sides of the central portion; moving the substrate and the mask relative to one another such that the first side portion of each transmissive region overlaps the central portion of each first irradiated region; and irradiating the laser beam onto the amorphous silicon layer a second time through the mask to form a plurality of second irradiated regions corresponding to the plurality of transmissive regions.

In another aspect of the present invention, a mask of a laser apparatus for forming a polycrystalline silicon layer includes: a plurality of transmissive regions, the plurality of transmissive regions being disposed in a stairstep arrangement along a first direction and spaced apart from each other along a second direction, each transmissive region having a central portion, and first and second side portions at both sides of the central portion; and a shielding region screening a laser beam of the laser apparatus.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the embodiment of the present invention, example of which is illustrated in the accompanying drawings. Wherever possible, similar reference numbers will be used throughout the drawings to refer to the same or like parts.

Figure 1:
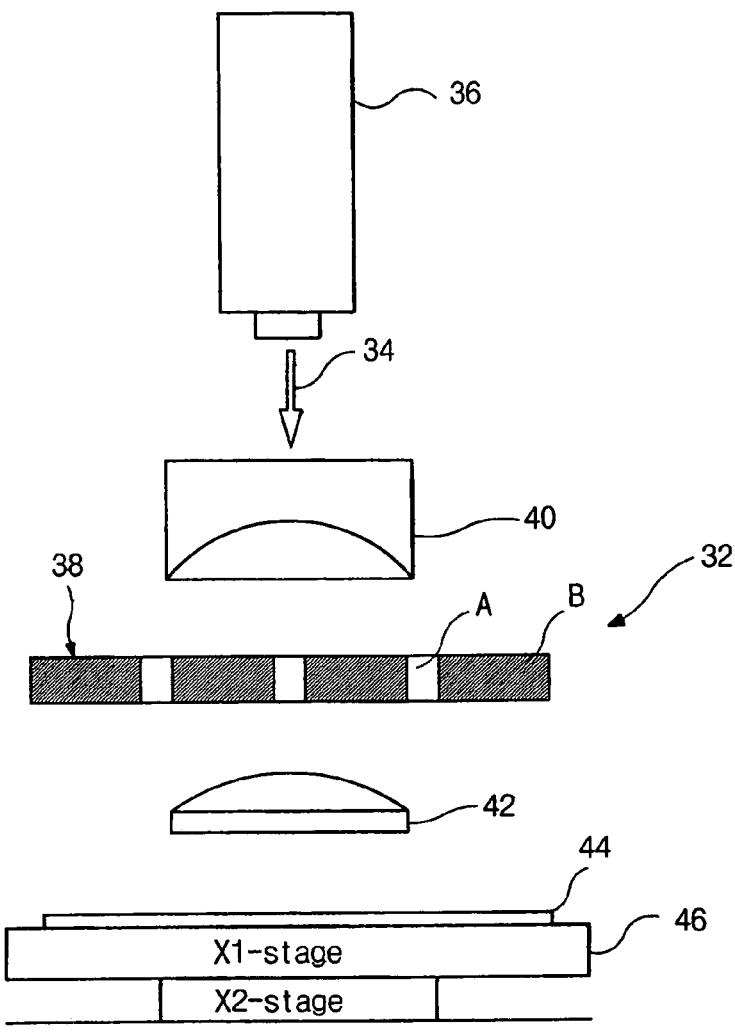
FIG. 1 is a schematic view showing a configuration of an apparatus for a sequential lateral solidification method according to the related art.
Figure 2A:
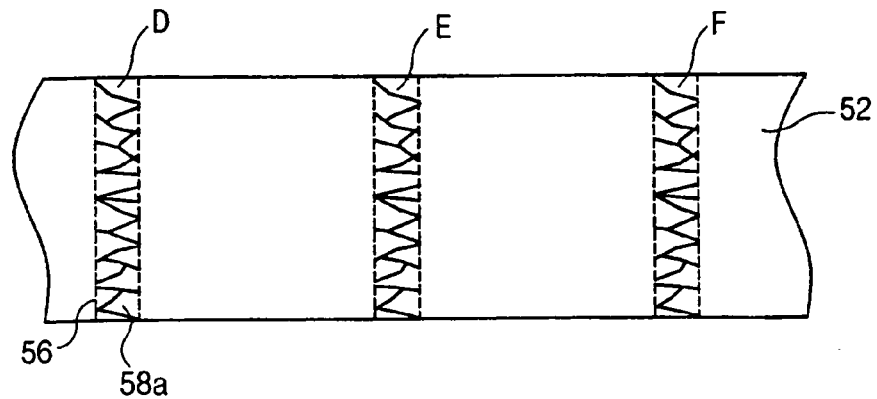
FIGS. 2A to 2C are schematic plane views showing crystallization states of an amorphous silicon layer by a sequential lateral solidification method according to the related art.
Figure 2B:
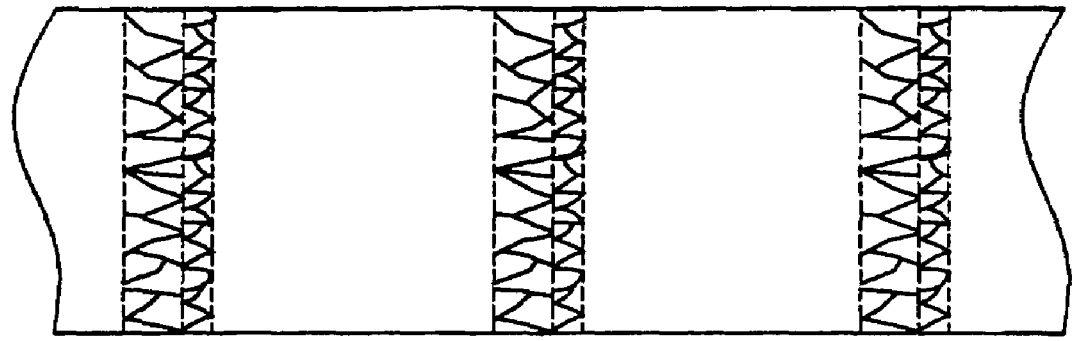
Figure 2C:
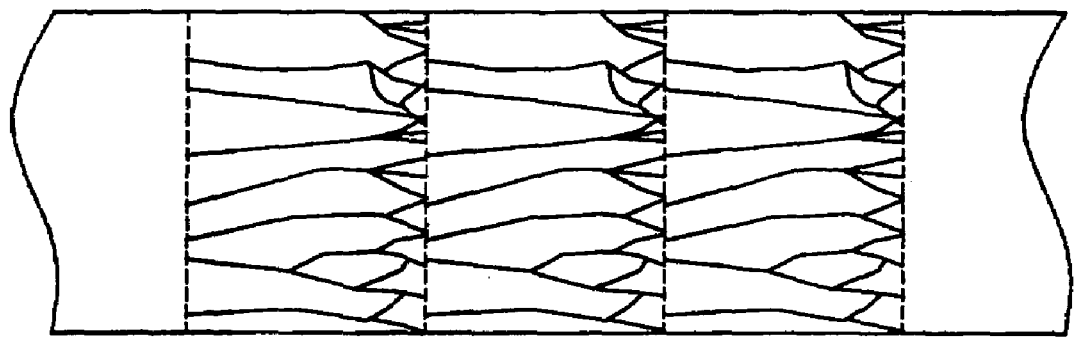
Figure 3:
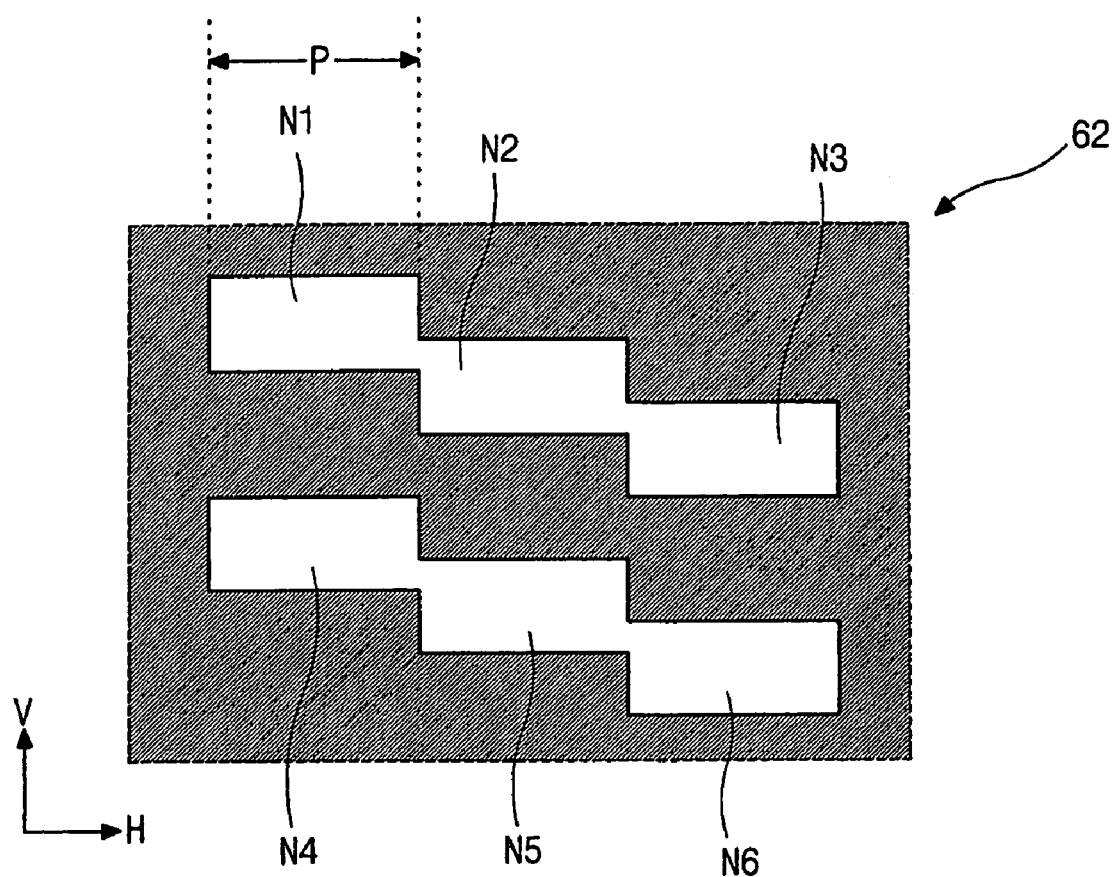
FIG. 3 is a schematic plane view showing a pattern shape of a mask for a sequential lateral solidification method according to the related art.
Figure 4A:
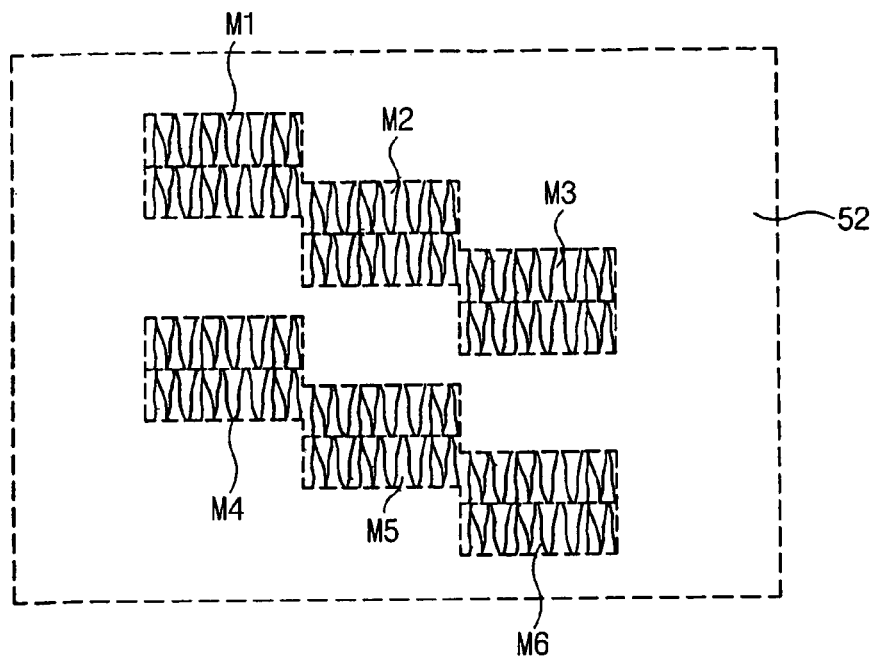
FIGS. 4A to 4D are schematic plane views showing crystallization states of an amorphous silicon layer by a sequential lateral solidification method according to the related art.
Figure 4B:
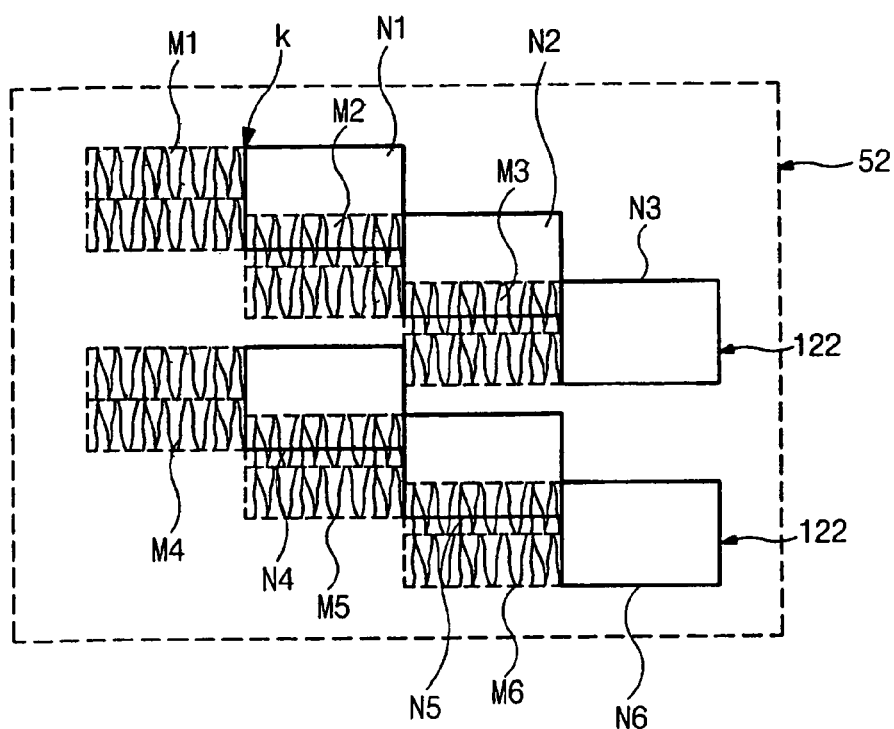
Figure 4C:
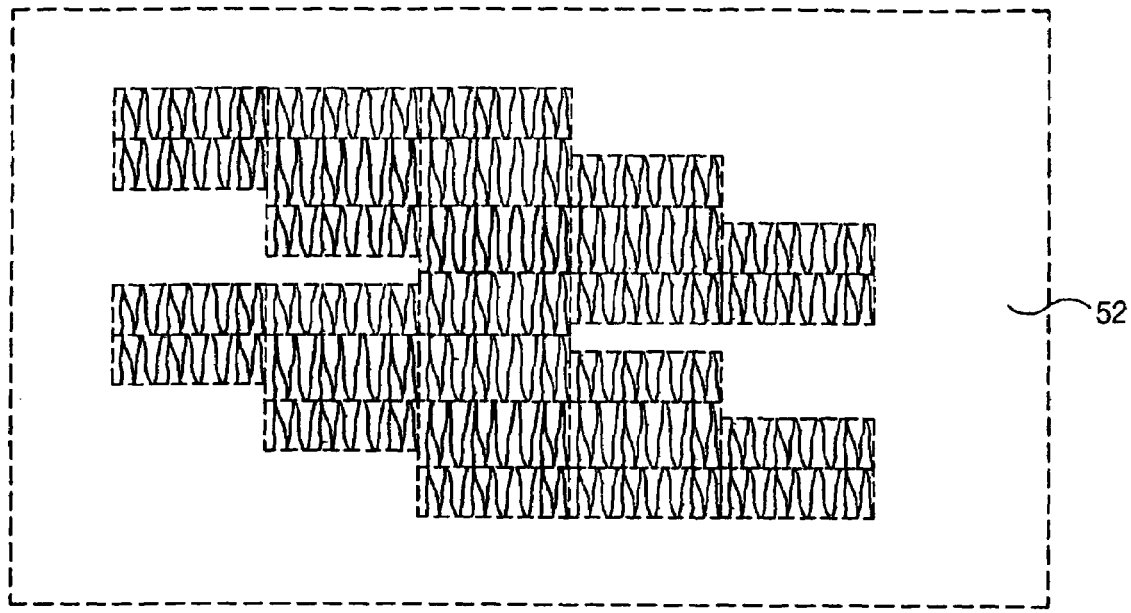
Figure 4D:
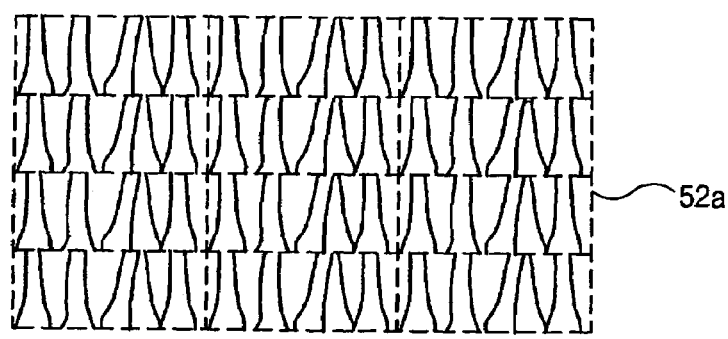
Figure 5A:
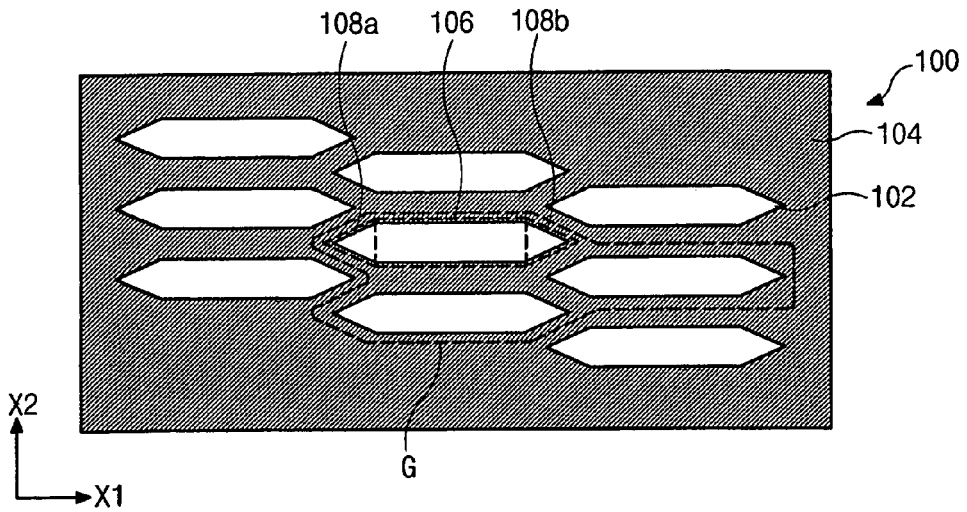
FIG. 5A is a schematic plane view showing a pattern shape of a mask for a sequential lateral solidification method according to an embodiment of the present invention.

FIG. 5A is a schematic plane view showing a pattern shape of a mask for a sequential lateral solidification (SLS) method according to an embodiment of the present invention.

In FIG. 5A, a mask 100 for a SLS method includes a plurality of transmissive regions 102 and a shielding region 104. A laser beam passes through the plurality of transmissive regions 102 and is screened by the shielding region 104. The plurality of transmissive regions 102 maybe arranged such that each transmissive region 102 has an identical shape and maybe repeated along first and second directions X1 and X2, which may be substantially perpendicular to each other. Each transmissive region 102 includes a central portion 106 and first and second side portions 108a and 108b at both sides of the central portion 106. The central portion 106 may have a substantially rectangular shape composed of two long sides and two short sides, and the first and second side portions 108a and 108b may have a tapered shape where the width is gradually diminished. Each transmissive region 102 as a whole may have a long substantially hexagonal shape. The first and second side portions 108a and 108b may also have a half circle shape or a half ellipse shape. The long sides of the central portion 106 are substantially parallel to the first direction X1. In a subsequent moving step of the SLS method, the mask 100 (or a substrate) moves along the first direction X1, i.e., a direction substantially parallel to the long sides of the central portion 106.

The plurality of transmissive regions 102 may be disposed in a stairstep arrangement along the first direction X1 and spaced apart from each other along the second direction X2. For example, one transmissive region N5 has right and left adjacent transmissive regions N3 and N6 along the first direction X1, and top and bottom adjacent transmissive regions N2 and N8 along the second direction X2. The one transmissive region N5 and one of the right and left adjacent transmissive regions N3 and N1 are disposed along the first direction X1 to have a step. The one transmissive region N5 and one of the top and bottom transmissive regions N2 and N8 are disposed along the second direction X2 to be substantially parallel to and spaced apart from each other.

Figure 5B:
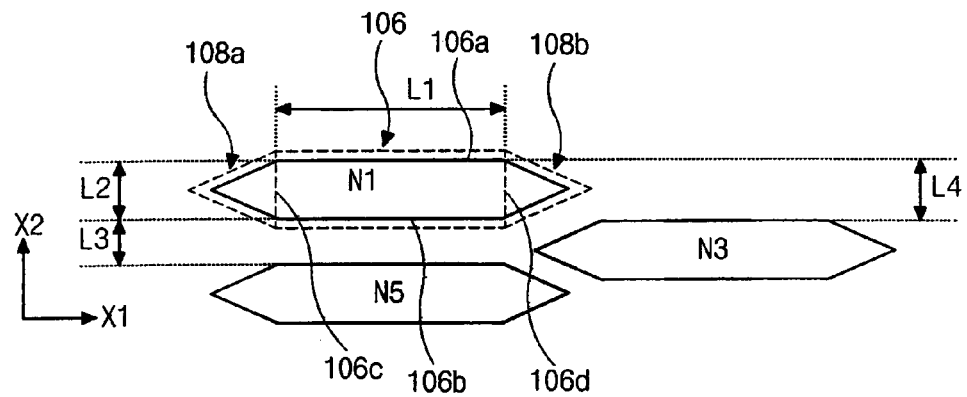
FIG. 5B is a magnified view of a portion G of FIG. 5A.

FIG. 5B is a magnified view of a portion G of FIG. 5A. In FIG. 5B, one transmissive region N1 has a central portion 106 and first and second side portions 108a and 108b on each side of the central portion 106. The central portion 106 has a substantially rectangular shape with first and second long sides 106a and 106b substantially parallel to a first direction X1, and first and second short sides 106c and 106d substantially parallel to a second direction X2. The first and second long sides 106a and 106b have a first length L1 and the first and second short sides 106c and 106d have a second length L2. The one transmissive region N1 and a bottom adjacent transmissive region N5 are disposed along the second direction X2 to have a first distance L3 therebetween. The one transmissive region N1 and right adjacent transmissive region N3 are disposed along the first direction X1 to have a second distance L4 between the first long sides thereof. The first distance L3 is less then the second length L2. When the one transmissive region N1 and the right adjacent region N3 are moved along the first direction X1, the right adjacent region N3 meets or overlaps the one transmissive region N1. Moreover, the second distance L4 is greater than one half of the second length L2 and less than the second length L2. The first distance L3 corresponds to the width of the shielding region 104 between the one transmissive region N1 and a bottom adjacent transmissive region N5. In a subsequent step of the SLS method, the mask moves by a pitch equal or less than the first length L1 along the first direction X1. Accordingly, the first and second side portions 108a and 108b of the adjacent transmissive regions are disposed over a virtual line substantially parallel to the second direction X2 to crystallize an entire amorphous silicon layer.

Figure 5C:
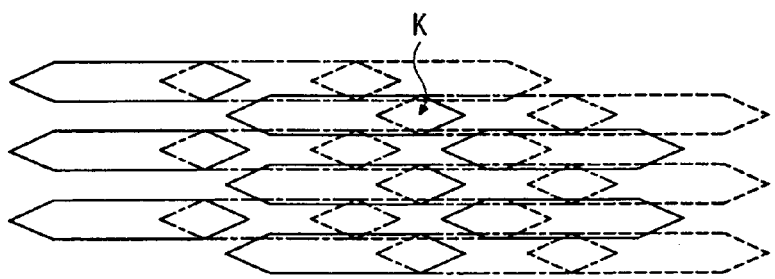
FIG. 5C is a schematic plane view showing a state of laser irradiation according to an embodiment of the present invention.

FIG. 5C is a schematic plane view showing the state of laser irradiation according to an embodiment of the present invention. The solid line shows the first irradiated regions, the dash-dot line shows second irradiated regions, and the dotted line shows third irradiated regions.

In FIG. 5C, a plurality of first irradiated regions are formed by first irradiating a laser beam through a mask. After the mask (or a substrate) moves by a first length L1 (FIG. 5B) in direction X1, the laser beam irradiates the amorphous silicon layer a second time to form a plurality of second irradiated regions. Because the plurality of second irradiated regions cover the space between the plurality of first irradiated regions, one section of the amorphous silicon layer is fully crystallized by the first and second irradiations. For the convenience of illustration, the mask has two columns of the transmissive regions in FIG. 5C. Accordingly, the laser beam irradiates another section of the amorphous silicon layer after the mask moves by the first length L1 (FIG. 5B). The third irradiation corresponds to the first irradiation for another section.

To reduce the process time, the mask can be designed to have n columns (not shown) of the transmissive regions. After first and second irradiations are performed for one section, the mask moves to a new position for the crystallization of another section. In the new position, first side portions of the transmissive regions overlap second side portions of nth column of the second irradiated regions. After the mask moves to the new position, the laser beam irradiates the amorphous silicon layer a third time for another section. The entire amorphous silicon layer may be crystallized by repeating the movements and irradiations. Because the mask moves to the next section by a distance longer than the first length L1 (FIG. 5B) corresponding to the number of columns of transmissive regions, the process time may be reduced. Moreover, because the second side portions of each first irradiated region overlap the central portion of each second irradiated region (shown in a portion K), the insufficiently crystallized amorphous silicon layer is re-crystallized in the second irradiation. Therefore, a poor crystallinity due to diffraction at edge is improved.

Figure 6A:
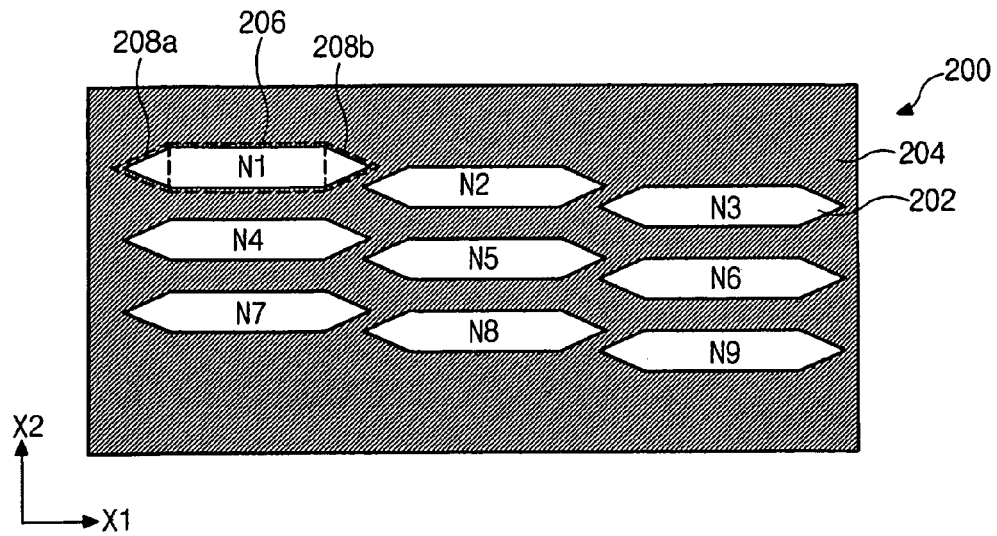
FIG. 6A is a schematic plane view showing the pattern shape of a mask for a sequential lateral solidification method according to another embodiment of the present invention.

FIG. 6A is a schematic plane view showing the pattern shape of a mask for a sequential lateral solidification method according to another embodiment of the present invention.

In FIG. 6A, a mask 200 for a SLS method may include a plurality of transmissive regions 202 and a shielding region 204. A laser beam may pass through the plurality of transmissive regions 202 and may be screened by the shielding region 204. The plurality of transmissive regions 202 may be disposed such that each transmissive region 202 has an identical shape and may repeat along first and second directions X1 and X2 substantially perpendicular to each other. Each transmissive region 202 includes a central portion 206 and first and second side portions 208a and 208b at both sides of the central portion 206. The central portion 206 may have a substantially rectangular shape composed of two long sides and two short sides, and the first and second side portions 208a and 208b may have a tapered shape where the width is gradually diminished. Each transmissive region 202 as a whole may have a long substantially hexagonal shape. The first and second side portions 208a and 208b may also have a half circle shape or a half ellipse shape. The long sides of the central portion 206 are substantially parallel to the first direction X1. In a subsequent moving step of the SLS method, the mask 200 (or a substrate) moves along the first direction X1, i.e., a direction substantially parallel to the long sides of the central portion 206.

The plurality of transmissive regions 202 may be disposed in a stairstep arrangement along the first direction X1 and spaced apart from each other along the second direction X2. For example, one transmissive region N5 has right and left adjacent transmissive regions N6 and N4 along the first direction X1, and top and bottom adjacent transmissive regions N2 and N8 along the second direction X2. The one transmissive region N5 and one of the right and left adjacent transmissive regions N6 and N4 are disposed along the first direction X1 to have a step. The one transmissive region N5 and one of the top and bottom transmissive regions N2 and N8 are disposed along the second direction X2 to be parallel to and spaced apart from each other.

Figure 6B:
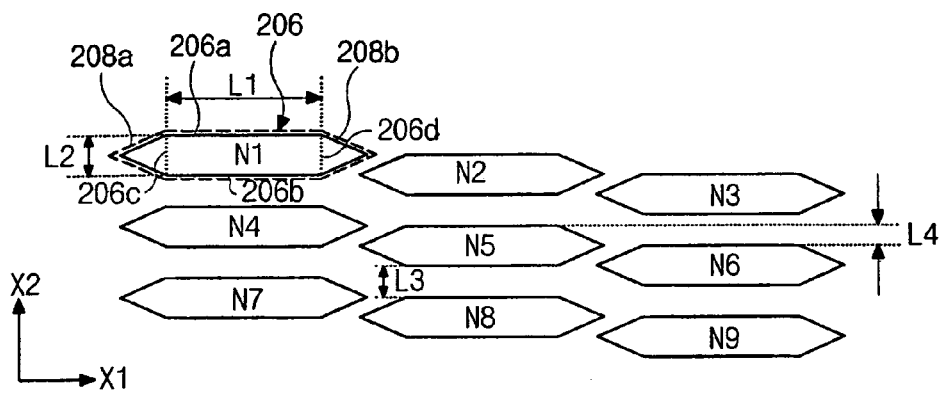
FIG. 6B is a schematic view showing the positional relationship between a plurality of transmissive regions of a mask according to another embodiment of the present invention.

FIG. 6B is a schematic view showing a positional relationship between a plurality of transmissive regions of a mask according to another embodiment of the present invention.

In FIG. 6B, one transmissive region N1 has a central portion 206 and first and second side portions 208a and 208b on each side of the central portion 206. The central portion 206 has a substantially rectangular shape with first and second long sides 206a and 206b substantially parallel to a first direction X1, and first and second short sides 206c and 206d substantially parallel to a second direction X2. The first and second long sides 206a and 206b have a first length L1 and the first and second short sides 206c and 206d have a second length L2. The one transmissive region N5 and a bottom adjacent transmissive region N8 are disposed along the second direction X2 to have a first distance L3 therebetween. The one transmissive region "N5" and right adjacent transmissive region N6 are disposed along the first direction X1 to have a second distance L4 between the first long sides thereof. The first distance L3 depends on the number of the adjacent transmissive regions N4 to N6 along the first direction X1. The first distance L3 is determined such that a last transmissive region N3 of a first row meets or overlaps a first transmissive region N4 of a second row when the two transmissive regions N3 and N4 are parallel moved along the first direction X1. The second distance L4 is less than one half of the second length L2. The first distance L3 corresponds to the width of the shielding region 204 between the one transmissive region N5 and a bottom t adjacent transmissive region N8. In a subsequent step of the SLS method, the mask moves by a pitch equal or less than the first length L1 along the first direction X1. Accordingly, the first and second side portions 208a and 208b of the adjacent transmissive regions are disposed over a virtual line substantially parallel to the second direction X2 to crystallize an entire amorphous silicon layer.

Figure 6C:
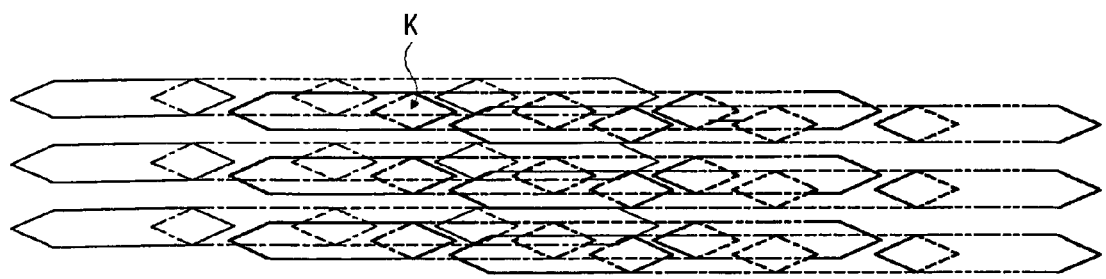
FIG. 6C is a schematic plane view showing a state of laser irradiation according to another embodiment of the present invention.

FIG. 6C is a schematic plane view showing the state of laser irradiation according to another embodiment of the present invention. The solid line shows the first irradiated regions, the dash-dot line shows second irradiated regions, the dotted line shows third irradiated regions, and the dash-dot-dot line shows fourth irradiated regions.

In FIG. 6C, a plurality of first irradiated regions are formed by first irradiating a laser beam through a mask. After the mask (or a substrate) moves by a first distance L1 (FIG. 6B) in direction X1, the laser beam irradiates the amorphous silicon layer a second time to form a plurality of second irradiated regions. After the mask (or the substrate) moves again by the first distance L1 (FIG. 6B), the laser beam irradiates the amorphous silicon layer a third time to form a plurality of third irradiated regions. Grains in the first and secondly irradiated regions grow and residual amorphous silicon regions are crystallized through the third irradiation. Because the plurality of second irradiated regions and the plurality of third irradiated regions cover a space between the plurality of first irradiated regions, one section of the amorphous silicon layer is fully crystallized by first, second, and third irradiations. For this example, the mask has three columns of the transmissive regions in FIG. 6C. Accordingly, the laser beam irradiates another section of the amorphous silicon layer a fourth time after the mask moves by the first distance L1 (FIG. 6B). The fourth irradiation corresponds to the first irradiation for another section.

To reduce the process time, the mask can be designed to have n columns (not shown) of the transmissive regions. After first, second and third irradiations are performed for one section the mask moves to a new position for the crystallization of another section. In the new position, first side portions of the transmissive regions overlap second side portions of nth column of the third irradiated regions. After the mask moves to the new position, the laser beam irradiates the amorphous silicon layer a fourth time for another section. The entire amorphous silicon layer may be crystallized by repeating the movements and irradiations. Because the mask moves to the next section by a distance longer than the first distance L1 (FIG. 6B) corresponding to the number of columns of transmissive regions, the process time can be reduced. Moreover, because the second side portions of each first irradiated region overlap the central portion of each second irradiated regions and/or the central portion of each third irradiated regions (shown in a portion K), the insufficiently crystallized amorphous silicon layer is re-crystallized in the second and/or third irradiations. Therefore, a poor crystallinity due to diffraction at edge is improved.

Consequently, the insufficiently crystallized portions due to diffraction at edge of the mask are sufficiently crystallized through the subsequent second and third irradiation of the laser beam. This improvement of crystallinity produces improved electrical characteristics of a device using the polycrystalline silicon. Moreover, because the side portions has a tapered shape, the reliability of the crystallization process is improved.

It will be apparent to those skilled in the art that various modifications and variation can made in the present invention without departing from the spirit or scope of the invention. Thus, it is intended that the present invention cover the modifications and variations of this invention provided they come within the scope of the appended claims and their equivalents.

What is claimed is:

1. An apparatus for forming a polycrystalline silicon layer from an amorphous silicon layer, comprising:
   a laser that irradiates the amorphous layer to form a polycrystalline layer; and
   a mask with a shielding region and a plurality of transmissive regions, wherein the plurality of transmissive regions are arranged in a stairstep arrangement spaced apart from each other in a first direction and a second direction substantially perpendicular from the first direction, wherein each transmissive region has a central portion and first and second portions adjacent to the central portion on opposite sides of the central portion along the first direction, wherein each of the portions has a length along the first direction and a width along the second direction, and wherein the width of the first and second side portions decreases away from the central portion along the first direction.

2. The apparatus according to claim 1, wherein the first and second side portions are tapered.

3. The apparatus according to claim 1, wherein the first and second side portions are triangular.

4. The apparatus according to claim 1, wherein the central portion is rectangular.

* * * * *